United States Patent [19]

Nukiyama

[11] Patent Number: 4,809,229

[45] Date of Patent: Feb. 28, 1989

[54] DATA PROCESSING INTEGRATED CIRCUIT WITH IMPROVED DECODER ARRANGEMENT

[75] Inventor: Tomoji Nukiyama, Tokyo, Japan

[73] Assignee: NEC Corporation, Tokyo, Japan

[21] Appl. No.: 763,189

[22] Filed: Aug. 7, 1985

[30] Foreign Application Priority Data

Aug. 7, 1984 [JP] Japan .................. 59-165265

[51] Int. Cl.$^4$ .................. G11C 7/00; G11C 8/00
[52] U.S. Cl. .................. 365/189; 365/230
[58] Field of Search .................. 365/230, 189

[56] References Cited

U.S. PATENT DOCUMENTS

| 4,443,864 | 4/1984 | McElroy | 365/230 |
| 4,449,207 | 5/1984 | Kung et al. | 365/230 |
| 4,566,082 | 1/1986 | Anderson | 365/230 |
| 4,672,587 | 6/1987 | Geiger et al. | 365/230 |

FOREIGN PATENT DOCUMENTS 0029322  5/1981  European Pat. Off. ........ 365/230 X

Primary Examiner—Stuart N. Hecker
Assistant Examiner—Glenn A. Gossage
Attorney, Agent, or Firm—Foley & Lardner, Schwartz, Jeffery, Schwaab, Mack, Blumenthal & Evans

[57] ABSTRACT

An improved data processing IC chip which can be fabricated with a reduced area is disclosed. The data processing chip includes a plurality of memory blocks provided at different locations. The memory blocks are adapted to be selected by decoded outputs. Each of the memory blocks is provided with a unit decoding circuit for producing a decoded output therefor and the unit decoding circuit is located close to the associated memory block.

6 Claims, 6 Drawing Sheets

DATA PROCESSING INTEGRATED CIRCUIT WITH IMPROVED DECODER ARRANGEMENT

BACKGROUND OF THE INVENTION

The present invention relates to a data processing device on an integrated circuit (IC) chip, such as a micro processor, and more particularly to a word access structure for memory blocks or registers provided in the data processing chip.

Data processing chips have been widely utilized in various data or information processing fields. A plurality of memory blocks or registers are provided in the data processing chip, and each of the memory blocks or registers is assigned by it's own word. A decoder circuit is employed to select one of the words so that one of the memory blocks or registers is selected by the selected word. In the case where the number of the words, i.e. the number of memory blocks or registers are 256, the decoder receives 8-bit of address signals and 256 memory selection lines are derived from the decoder to the memory blocks or registers. However, the memory blocks or registers are usually located at different portions on the chip according to their functions in the data processing device, whereas the decoder circuit for selecting one of the 256 memory selection lines is provided at a certain location. Accordingly, the 256 memory selection lines are inevitably running between the decoder circuit and the respective memory blocks on the data processing chip, thus occupying a large area on the chip. Therefore, it has been difficult to obtain a data processing chip having a high-integration density.

SUMMARY OF THE INVENTION

It is an object of the present invention to provide a data processing chip having a high-integration density.

It is another object of the present invention to provide a data processing IC chip in which the amount of wiring and a number of circuit elements are reduced.

The data processing device according to the present invention is of the type having a plurality of memory blocks provided at different locations of an IC chip and a decoder circuit including a plurality of unit decoding circuits, an output of each unit decoding circuit being applied to each one of the memory blocks, and featured in that each of the unit decoding circuits is located adjacent to each one of the memory blocks.

According to the present invention, the amount of wiring between the unit decoding circuits and the memory blocks can be made substantially negligible, while instead of providing output wirings of the decoder, a relatively small number of input access signal wires are provided between input portions of the input access signals and the unit decoding circuits. Therefore, the area of the chip occupied by the wires up to the memory blocks can be remarkably reduced. For example, in the case where the number of the unit decoding circuits is $2^n$, $2^n$ output wires must be provided according to the prior art, whereas the present invention can be achieved by 2 n wires therefor.

DETAILED DESCRIPTION OF THE INVENTION

Figure 1:
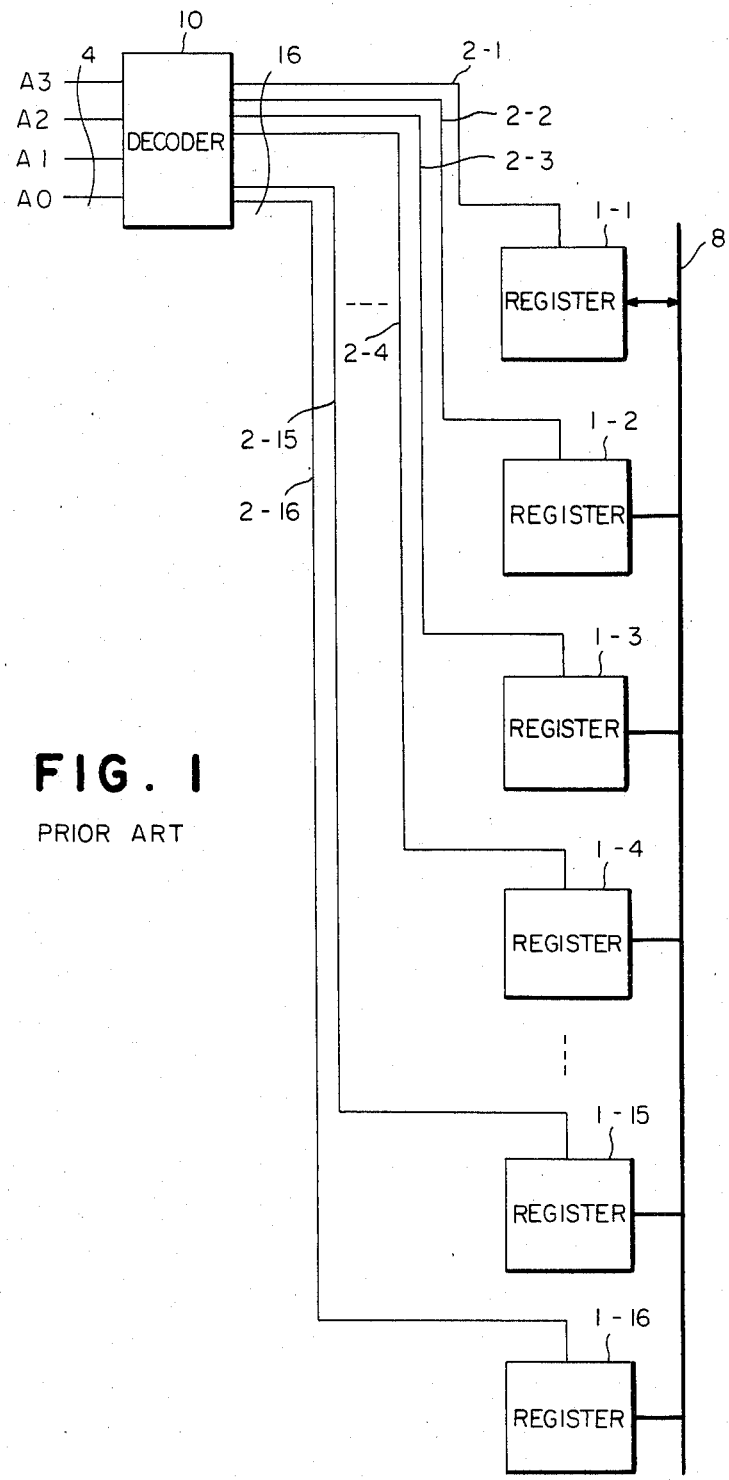
FIG. 1 is a block diagram of a word access structure in a prior art data processing chip.

Referring to FIG. 1, a word access structure of a data processing chip according to a prior art is described.

Sixteen registers 1-1 to 1-16 are arranged along a data bus line 8 of 8-bits and operatively connected thereto. A decoder circuit 10 receives four bits of independent address signals A0 to A3 and selects one of the registers 1-1 to 1-16. Sixteen selection wirings 2-1 to 2-16 are provided between the decoder 10 and the registers 1-1 to 1-16, respectively, in order that a selection signal is transmitted from the decoder 10 to a selected register therethrough. Each of the registers 1-1 to 1-16 has 8-bit storage capacity and performs a read or write operation to or from the bus line 8 when it is selected by the decoder 10.

Figure 2:
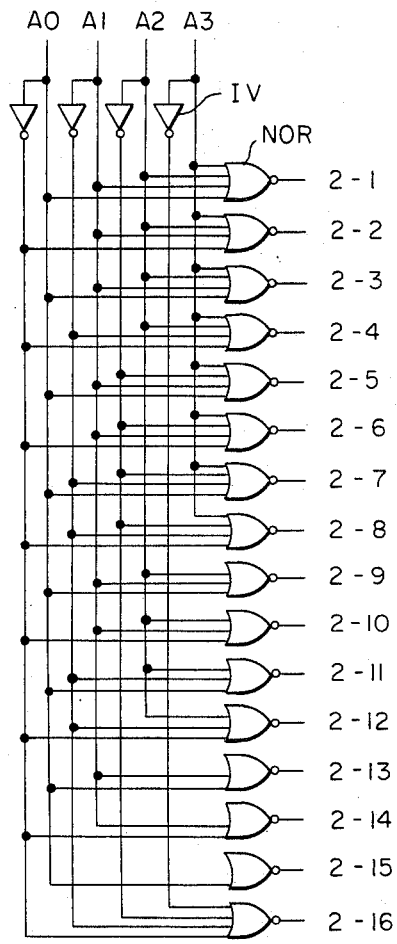
FIG. 2 is a block diagram of a decoder circuit employed in the chip of FIG. 1.

FIG. 2 shows a structure of the decoder 10. Inverters IV produce complementary signals of the address signals A0 to A3 and true and complementary signals of A0 to A3 are applied to inputs of 16 NOR gates NOR in predetermined combinations as shown and outputs of these NOR gates NOR are coupled to the selection wirings 2-1 to 2-16.

As shown in FIG. 1, according to the prior art, 16 selection wirings 2-1 to 2-16 are provided between the decoder 10 and the separately located registers 1-1 to 1-16, and the entire wiring length is very large. Accordingly, the area occupied by the selection wires is very large on the IC chip, and high-integration arrangement of a large number of circuit elements has been difficult.

Figure 3:
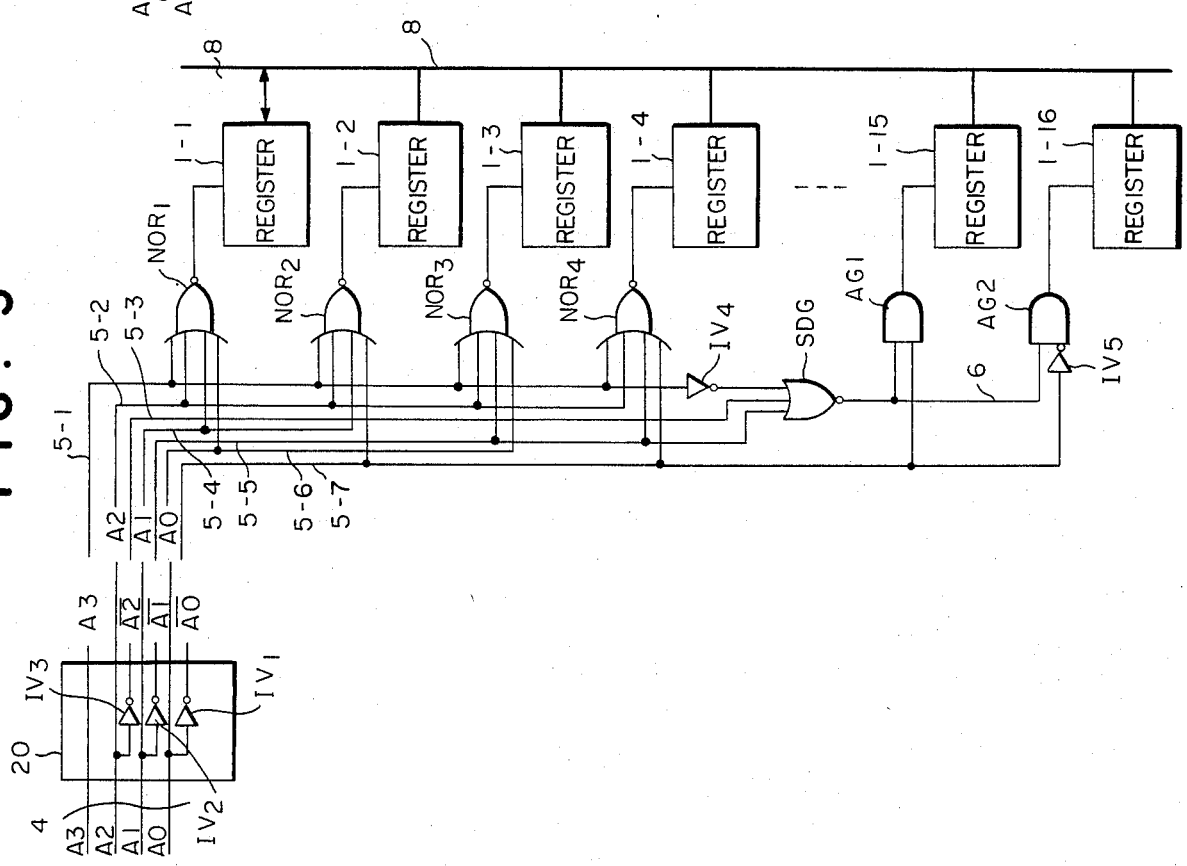
FIG. 3 is a block diagram showing a first embodiment of the present invention.

Referring to FIG. 3, a data processing IC according to a first embodiment of the invention is described. 16 registers 1-1 to 1-16 are arranged along the 8-bit bus line 8 and operatively connected to the bus line similarly to the case of FIG. 1. An address input circuit 20 receives 4 bits of address signals $A_0$ to $A_3$ and produces complementary signals $\overline{A}_0$, $\overline{A}_1$ and $\overline{A}_2$ with respect to the signals $A_0$, $A_1$ and $A_2$ via inverters $IV_1$, $IV_2$ and $IV_3$, respectively. With respect to the address signal $A_3$, no complementary signal is produced by the address input circuit 20. Thus, the signal $A_3$ and true and complementary signals $A_0$, $\overline{A}_0$; $\overline{A}_1$, $A_1$ and $A_2$, $\overline{A}_2$ are outputted from the address input circuit 20. From the address input circuit 20, seven address wirings 5-1 to 5-7 are arranged for carrying the above signals from the address input circuit 20. Adjacent to the registers 1-1 to 1-16, logic gates $NOR_1$, $NOR_2$ . . . , $AG_1$ and $AG_2$ are provided. Each of these logic gates serve as a unit decoding circuit whose output is used to select or enable the associated register and has inputs coupled to a part of the address wirings 5-1 to 5-7 in a predetermined combination. For example, the logic gate $NOR_1$ provided for the register 1-1 has inputs coupled to the address wirings 5-1, 5-2, 5-4 and 5-6 to receive all the true signals $A_0$, $A_1$, $A_2$ and $A_3$. When all the signals $A_0$, $A_1$, $A_2$ and $A_3$ are not a logic "1" level, the output of the logic gate $NOR_1$ assumes logic "1" level so that the register 1-1 is selected and a read or write operation is conducted with respect to the register 1-1. Similarly, the logic gate NOR$_2$ has inputs coupled to the address wirings 5-1, 5-2, 5-4 and 5-7 to receive the address signals A$_3$, A$_2$, A$_1$ and $\overline{A_0}$. A sub-decoding gate SDG is composed of a NOR gate receiving the signals $\overline{A_1}$ and $\overline{A_2}$ and an inverted signal $\overline{A_3}$ of the signal A$_3$ via an inverter IV$_4$. The sub-decoding gate SDG produces a logic output of $(\overline{A_1 + A_2 + A_3})$ at its output and the logic output of the gate SDG is applied to an input of an AND gate AG$_1$ for selecting the register 1-15 as well as the signal applied to another input of the gate AG$_1$ Also, the logic output of the gate SDG is applied to an input of the AND gate AG$_2$ for selecting the register 1-16 as well as a further inverted signal $\overline{A_0}'$ of the signal $\overline{A_0}$ by an inverter IV$_5$. In this arrangement, by providing the sub-decoding gate SDG at a position relatively close to the gates AG$_1$ and AG$_2$ which necessitate the signals $\overline{A_3}$, $\overline{A_2}$ and $\overline{A_1}$ as parts of inputs, a single wiring 6 coupled between the gate SDG and the gates AG$_1$ and AG$_2$ can convey the signals $\overline{A_3}$, $\overline{A_2}$ and $\overline{A_1}$ in substance. Also, an inverter IV$_4$ for obtaining the inverted signal $\overline{A_3}$ of the signal A$_3$ is provided not within the address input circuit 20 but at the location adjacent to the gate SDG which necessitates the signal $\overline{A_3}$. Accordingly, as compared to the case where the inverter IV$_4$ is provided within the circuit 20, a wiring for the signal $\overline{A_0}$ from the circuit 20 to the gate SDG can be avoided. Similarly, the insertion of the inverter IV$_5$ in front of the gate AG$_2$ also contributes to the reduction of the wiring length of the wiring 5-6 conveying the signal A$_0$. As illustrated in FIG. 3, the number of lines of the wirings from the address input circuit 20 to the registers 1-1 to 1-16 is seven at most. It is reduced to less than half of the wirings required in the prior art shown in FIGS. 1 and 2.

Thus, the area occupied by the wirings can be remarkably reduced by the invention.

Figure 4:
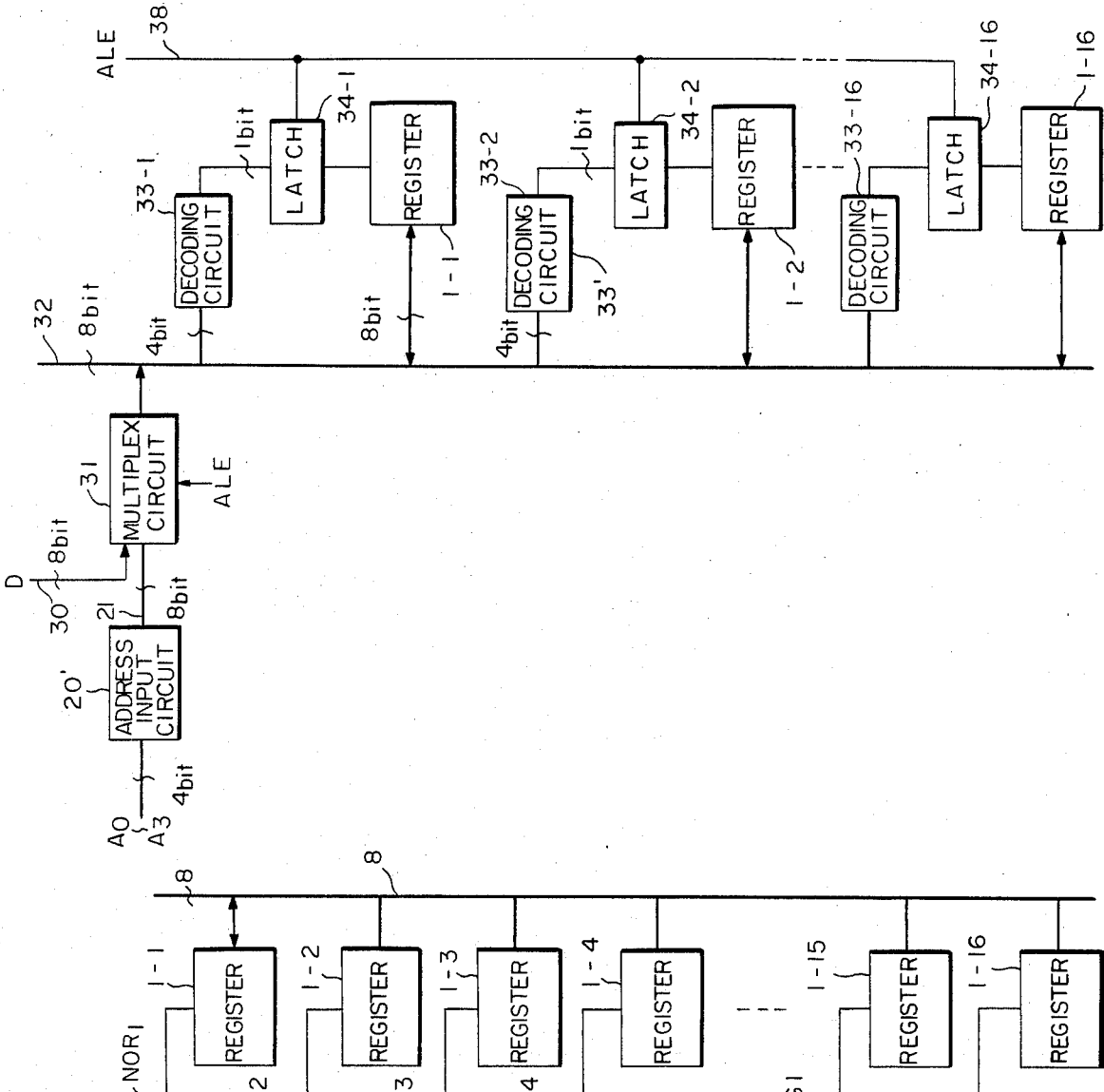
FIG. 4 is a block diagram of a second embodiment of the present invention.

Referring to FIG. 4, a second embodiment of the invention is described.

Instead of providing the address wirings 5-1 to 5-7 independently of the data bus line, this embodiment utilized an 8-bit bus line 32 both as a data bus line and as address signal line for transmitting data signals and address signals in a multiplexed manner.

An address input circuit 20' receives four bit address signals A to A$_3$ and generates their true and complementary signals A$_0$, $\overline{A_0}$, A$_1$, $\overline{A_1}$, A$_2$, $\overline{A_2}$ and A$_3$, $\overline{A_3}$ which are input to a multiplex circuit 31 through a 8-bit signal bus 21. The multiplex circuit 31 also receives an 8-bit data signal D via an 8-bit data line 30. The multiplex circuit 31 outputs either the 8-bit address signal or the 8-bit data signal to the bus line 32 in response to a control signal ALE applied thereto. When ALE is at logic "1", the multiplexer circuit 31 outputs the address signal to the bus line 32, while it outputs the data signal D to the bus line 32 when ALE is at logic "0". To the bus line 32, 16 registers 1-1 to 1-16 are operatively coupled at different locations. Unit decoding circuits 33-1 to 33-16 are also connected to the bus line 32 at respective locations close to the registers 1-1 to 1-16. The unit decoding circuits 33-1 to 33-16 may have the same structures as the gates NOR shown in FIG. 2. Their inputs are connected to predetermined four, three, two, or one bits of the bus line 32. Latch circuits 34-1 to 34-16 are coupled between the respective unit decoding circuits 33-1 to 33-16 and the respective registers 1-1 to 1-16 to latch the outputs of the unit decoding circuits in response to "1" level of the signal ALE which is applied via a separate control signal line 38. The outputs of the latch circuits 34-1 to 34-16 are used to enable the registers 1-1 to 1-16, respectively.

Operation of this embodiment is described below. First, during an addressing period when the signal ALE is at "1", the true and complementary signals from the address input circuit 20' are applied to the bus line 32 by the multiplex circuit 31. In response to the address signal on the bus line 32, one of the unit decoding circuits 33-1 to 33-16 produces a selection signal at its output. The selection signal is latched by the latch circuit associated with the selected unit decoding circuit, while other latch circuits store non-selected signals, in response to a logic "1" level of the signal ALE which enables the latch circuits 34-1 to 34-16. For example, when the unit decoding circuit 33-1 outputs a selection signal, the latch 34-1 holds the selection signal to enable the register 1-1. Then, during a data processing period when the signal ALE is at "0", the multiplex circuit 31 transmits the data signal D to the bus line 32, which is written into the enabled, i.e., selected register. Instead of this write operation, a read operation may be performed by transmitting the contents of the enabled register via the bus lines 32 to the data line 30.

Figure 5:
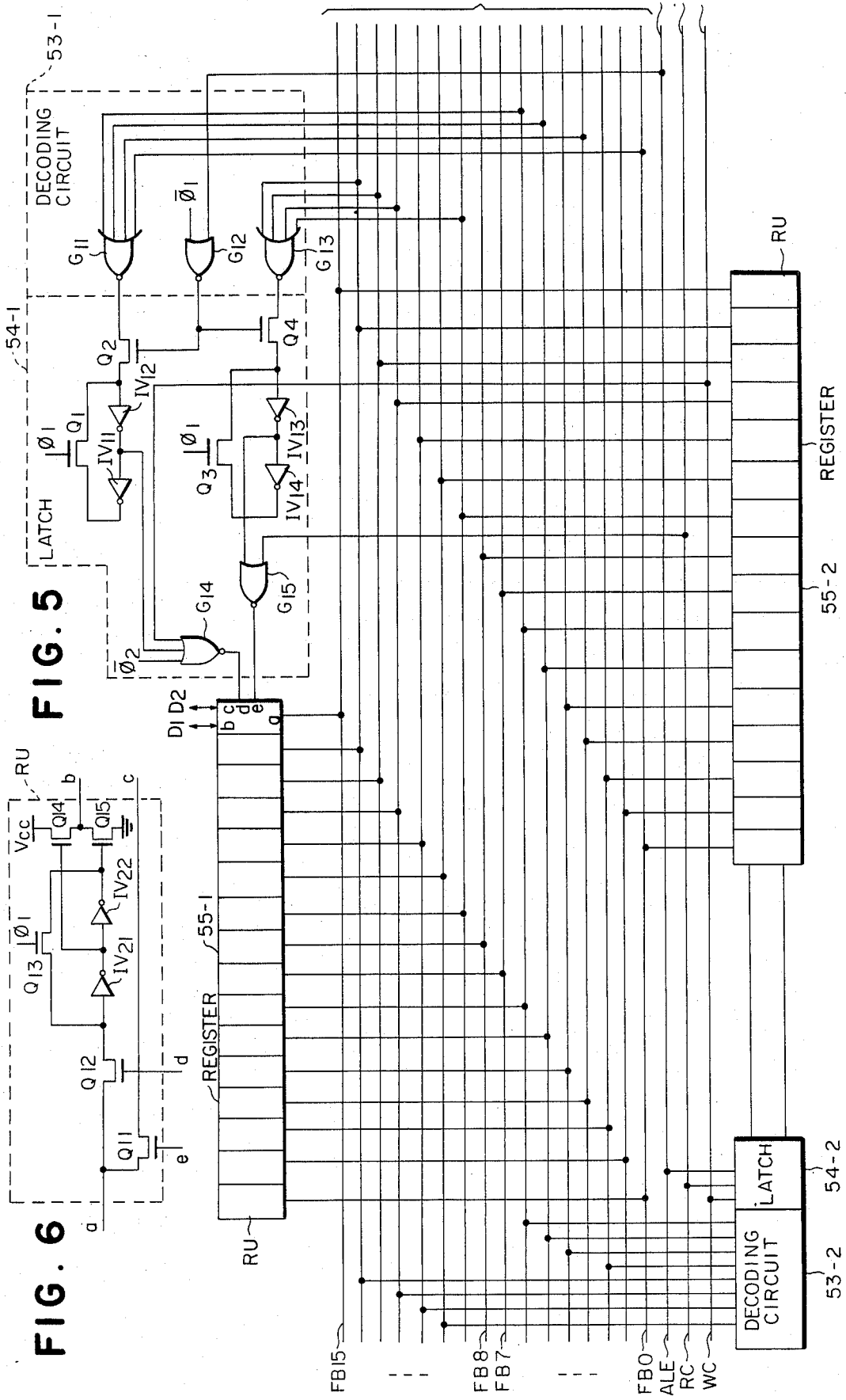
FIG. 5 is a circuit diagram of the major part of FIG. 4.
Figure 6:
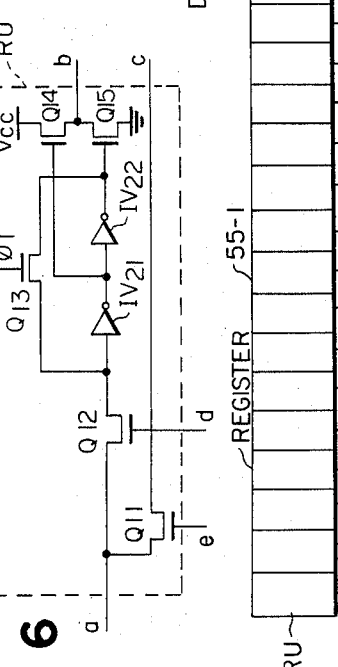
FIG. 6 is a circuit diagram of a storage unit in a register.

Referring to FIGS. 5 and 6, a practical example of the register, unit decoding circuit and latch circuit is described.

In FIG. 5, a bus line 52 is of 16 bits and includes 16 wirings for the respective bits FB$_0$ to FB$_{15}$. A signal line 58 for the signal ALE, a signal line 56 for a read control signal RC and a signal line 57 for a write control signal WC are arranged in parallel with the bus line 52. A plurality of 256 registers may be coupled to this bus line 52, but in this example, 16 registers are provided because 8 bits of the 16-bits bus line are used for addressing for one purpose (write operation) and the other 8 bits are employed for addressing for another purpose (read or transfer operation). Only two registers 55-1 and 55-2 among them are shown in FIG. 5. Each register consists of 16 bit storage units RU. Each of the storage units RU of the register 55 has an input "a" connected to a different one of the 16 bits wirings FB$_0$ to FB$_{15}$ of the bus line 52 as illustrated.

An example of the storage unit RU is shown in FIG. 6. Inverters IV$_{21}$ and IV$_{22}$ with a feedback transistor Q$_{13}$ form a latch circuit and transistors Q$_{14}$ and Q$_{15}$ form an output buffer circuit to output a stored signal to an output terminal "b". An input signal at an input terminal "a" is applied to the latch circuit via an input switch transistor Q$_{12}$ enabled by a control signal at a control terminal "d" or to another output terminal "c" directly via another switch transistor Q$_{11}$ enabled by another control signal at a terminal "e". Thus, in this example, the storage unit RU has a data input function of inputting a signal at the terminal "a" to a latch circuit as well as outputting an inverted signal at the terminal "b" when a logical "1" is applied to a terminal "d" and a data transfer function between the terminal "a" and a terminal "c" when a logic "1" is applied to a terminal "e".

Referring back to FIG. 5, each output terminal "b" of the storage unit RU is coupled to a data line D$_1$ and each output terminal "C" to another data line D$_2$. Each register, e.g. 55-1, is associated with a unit decoding circuit 53-1 and a latch circuit 54-1. In accordance with the above-mentioned data-input function and data-transfer function of the registers, two unit decoding circuits G$_{11}$ and G$_{13}$ and two latch circuits, one composed of inverters IV$_{11}$ and IV$_{12}$ and the other composed of inverters $IV_{13}$ and $IV_{14}$, are employed. Namely, the circuit $G_{11}$ and the latch circuit composed of the inverters $IV_{11}$ and $IV_{12}$ are provided for controlling the data input function, while the circuit $G_{13}$ and the latch circuit composed of the inverters $IV_{13}$ and $IV_{14}$ are provided for controlling the data transfer function. A NOR gate $G_{12}$ receives the signal ALE and a timing signal $\overline{\phi_1}$ and renders transistors $Q_2$ and $Q_4$ conductive so that the latch composed of $IV_{11}$ and $IV_{12}$ and the latch composed of $IV_{13}$ and $IV_{14}$ hold the outputs of the decoding circuit $G_{11}$ and $G_{13}$, respectively, when both ALE and at a "0" level. The latch circuits in 54-1 and in RU hold input data in response to a logic "1" level of a timing signal $\overline{\phi_1}$. A NOR gate $G_{14}$ receives the output of the latch ($IV_{11}$, $IV_{12}$), a timing signal $\overline{\phi_2}$ and the write control signal WC to control the terminal "d" of the units RU. A NOR gate $G_{15}$ receives the output of the latch ($IV_{13}$, $IV_{14}$) and the read control signal RC to control the terminal "e" of the units RU. The unit decoding circuit 53-2 and latch circuit 54-2 for the register 55-2 have the similar structure to 53-1 and 54-1. Half of the 16 registers 55-1, 55-3 (not shown)... 55-15 (not shown) are arranged on one side of the data bus 52, and the other half of the 16 registers 55-2, 55-4 (not shown), ... 55-16 (not shown) are arranged on the other side of the data bus 52.

During the addressing period, address signals for the data input function are provided on the 8-bit half $FB_8$ to $FB_{15}$ of the bus line 52 while address signals for the data transfer function are provided on the other 8-bit half $FB_0$ to $FB_7$ of the bus line 52, In operation, when the control signals ALE and RC are at logic "1", the output of the circuit $G_{13}$ is held by the latch composed of $IV_{13}$ and $IV_{14}$ and then applied to the terminal "e" through the gate $G_{15}$. When ALE and WC are at "0" level, the output of the unit decoder $G_{11}$ is written into the latch composed of $IV_{11}$ and $IV_{12}$ in response to "0" of $\phi_1$ ("1" of $\overline{\phi_1}$) and applied to the terminal "d" through the gate $G_{14}$ in response to "0" of $\overline{\phi_2}$.

As explained above, according to the present invention, amount of wirings for controlling a plurality of memory blocks or registers can be remarkably reduced.

I claim:

1. A data processing integrated circuit comprising:
   a bus line having a plurality of signal wirings arranged in parallel;
   a multiplex control line arranged in parallel with said bus, said multiplex control line carrying signals of first and second logic levels;
   a multiplexer coupled to said bus line for applying address information to said bus line when said multiplex control line is at said first logic level and applying data information to said bus line when said multiplex control line is at said second logic level;
   a write control line arranged in parallel with said bus line;
   a read control line arranged in parallel with said bus line;
   a plurality of memory blocks coupled to said bus line at different locations, a respective one of said memory blocks including a plurality of storage units, a respective one of said memory blocks including a data input terminal coupled to a respective one of said signal wirings of said bus line, a first output terminal for outputting data stored therein, a second output terminal, a first control terminal for controlling writing of data fed to said data input terminal, and a second control terminal for controlling transfer of data at said data input terminal to said second output terminal; and
   a plurality of selection circuits each provided for a respective one of said memory blocks and arranged closely adjacent said respective one of said memory blocks, each of said selection circuits including a first logic gate having input terminals coupled to said signal wirings of said bus line, a second logic gate having input terminals coupled to said signal wirings of said bus line, a first latch circuit, a second latch circuit, first means for determining a state of said first latch circuit in accordance with an output of said first logic gate when said multiplex control line is at said first logic level, second means for determining a state of said second latch circuit in accordance with an output of said second logic gate when said multiplex control line is at said first logic level, third means coupled to said write control line and said first latch circuit for selectively rendering the first control terminal of the storage unit of the associated memory block active, and a fourth means coupled to said read control line and said second latch circuit for selectively rendering the second control terminal of the storage unit of the associated memory block active.

2. The integrated circuit according to claim 1, in which a respective one of said first and second logic gates is a NOR gate.

3. The integrated circuit according to claim 1, in which said third means includes a NOR gate having first and second input terminals coupled to said write control line and said first latch circuit, respectively.

4. The integrated circuit according to claim 1, in which said fourth means includes a NOR gate having first and second input terminals coupled to said read control line and said second latch circuit.

5. The integrated circuit according to claim 1, in which each of said storage units includes a data latch circuit having an output coupled to said first output terminal, a first transfer gate coupled between said data input terminal and an input of said data latch circuit and having a control electrode coupled to said first control terminal, and a second transfer gate coupled to said input terminal and the output of said data latch circuit and having a control electrode coupled to said second control terminal.

6. A data processing integrated circuit comprising:
   a plurality of address signal lines arranged in parallel;
   a first control line arranged in parallel with said address signal lines;
   a second control line arranged in parallel with said address signal lines;
   a plurality of memory blocks arranged at different locations along said address signal lines, each of said memory blocks including at least one storage unit having a data input terminal, first and second output terminals, first and second control terminals, a data latch circuit having an output coupled to said first output terminal, a first transfer gate coupled between said data input terminal and an input of said data latch circuit, said first transfer gate having a control electrode coupled to said first control terminal, and a second transfer gate coupled between said data input terminal and said second output terminal, said second transfer gate having a control electrode coupled to said second control terminal;

and a plurality of selection circuits each provided for a respective one of said memory blocks, each of said selection circuits including first decoding means coupled to said address signal lines and said first control line for selectively rendering the first control terminal of the storage unit of the associated memory block active when said first control line is at an active level and second decoding means coupled to said address signal lines and said second control line for selectively rendering the second control terminal of the storage unit of said associated memory block active when said second control line is at an active level.

* * * * *